United States Patent

Tobe et al.

Patent Number: 6,080,446
Date of Patent: Jun. 27, 2000

[54] METHOD OF DEPOSITING TITANIUM NITRIDE THIN FILM AND CVD DEPOSITION APPARATUS

[75] Inventors: Ryoki Tobe; Yasuaki Tanaka; Atsushi Sekiguchi; Hitoshi Jimba, all of Tokyo, Japan; So Won Kim, Kyunggi-Do, Rep. of Korea

[73] Assignee: Anelva Corporation, Fuchu, Japan

[21] Appl. No.: 09/063,274

[22] Filed: Apr. 21, 1998

Related U.S. Application Data

[60] Provisional application No. 60/072,854, Jan. 28, 1998.

[30] Foreign Application Priority Data

Aug. 21, 1997 [JP] Japan .................................... 9-239100

[51] Int. Cl.$^7$ .................................................. C23C 16/00
[52] U.S. Cl. .............................. 427/255.394; 427/255.28; 427/126.1; 427/255.23; 427/314; 438/681
[58] Field of Search ....................... 427/255.394, 255.28, 427/255.23, 126.1; 438/681

[56] References Cited

U.S. PATENT DOCUMENTS

| | | | |
|---|---|---|---|
| 5,672,385 | 9/1997 | Jimba et al. .......................... | 427/248.1 |
| 5,763,007 | 6/1998 | Weiller ................................. | 427/248.1 |

FOREIGN PATENT DOCUMENTS 8-291385  11/1996  Japan .

OTHER PUBLICATIONS

Robert L. Jackson et al, "MOCVD of Titanium Nitride from TDEAT and NH3– Process Variables Affecting Step–coverage, Resistivity and Impurity Levels", Conference Proceedings ULSI–X 1995 Materials Research Society, pp. 223–229, No month data are available.

A. Intemann et al, "Applications and Properties of MOCVD Titanium Nitride", Conference Proceedings ULSI–X 1995 Materials Research Society, pp. 209–221, No month data are available.

Ivo J. Raaijmakers, "Low Temperature Metal–Organic Chemical Vapor Deposition Of Advanced Barrier Layers for the Microelectronics Industry", 1994—Elsevier Science S.A., pp. 85–93, No month data are available.

*Primary Examiner*—Roy V. King
*Attorney, Agent, or Firm*—Burns, Doane, Swecker & Mathis, LLP

[57] ABSTRACT

A method for fabricating a titanium nitride thin film in a reaction vessel on a surface of a substrate heated to a prescribed temperature, includes the steps of mixing tetrakis (dialkylamino)titanium (TDAAT) and a first carrier gas to create a first mixed gas; feeding the first mixed gas into the reaction vessel through a first set of nozzles; mixing an added gas reactive with the tetrakis(dialkylamino)titanium with a second carrier gas to create a second mixed gas; feeding the second mixed gas into the reaction vessel through a second set of nozzles; while controlling the flow rates of the TDAAT, added gas, firt and second carrier gases; and depositing a titanium nitride thin film by the first mixed gas and the second mixed gas while confining the pressure inside the reaction vessel to a range of 0.1–15 Pa.

5 Claims, 8 Drawing Sheets

TDAAT

R:alkyl group

Fig. 8

METHOD OF DEPOSITING TITANIUM NITRIDE THIN FILM AND CVD DEPOSITION APPARATUS

CROSS-REFERENCE TO RELATED APPLICATIONS

The nonprovisional application claims the benefit of prior filed, copending provisional application Ser. No. 60/072,854, filed on Jan. 28, 1998; the content of which is hereby incorporated herein be reference. This application also claims the benefit of priority under 35 U.S.C. §119 to Japanese Patent Application No. 9-239100, filed in Japan on Aug. 21, 1997; the content of which is also hereby Incorporated herein by reference.

BACKGROUND OF THE INVENTION

1. Field of the Invention

The present invention relates to a method for fabricating a titanium nitride thin film by CVD, and to a CVD apparatus therefor.

2. Related Art

Reactive sputtering methods featuring the use of metallic titanium targets and nitrogen gas have been primarily used in the past for growing titanium nitride thin films on the substrates of semiconductor devices, various electronic components, various sensors, and the like. In recent years, due to the creation of superfine, large-scale-integration silicon circuits, the design rules for DRAM of 64 Mbit and higher, require dimensions of about 0.35 μm or less, and cause the aspect ratio of contact holes in devices to gradually increase. A drawback of using titanium nitride thin films as barrier metals for such contact holes is that inadequate step coverage results when these titanium nitride thin films are deposited by conventional reactive sputtering. Unsatisfactory step coverage adversely affects the electrical characteristics of contact holes and is expected to pose a serious problem for creating the next generation of devices. It is therefore expected that conformal barrier metals will be formed using CVD techniques, which provide excellent coverage characteristics or filling characteristics.

Figure 8:
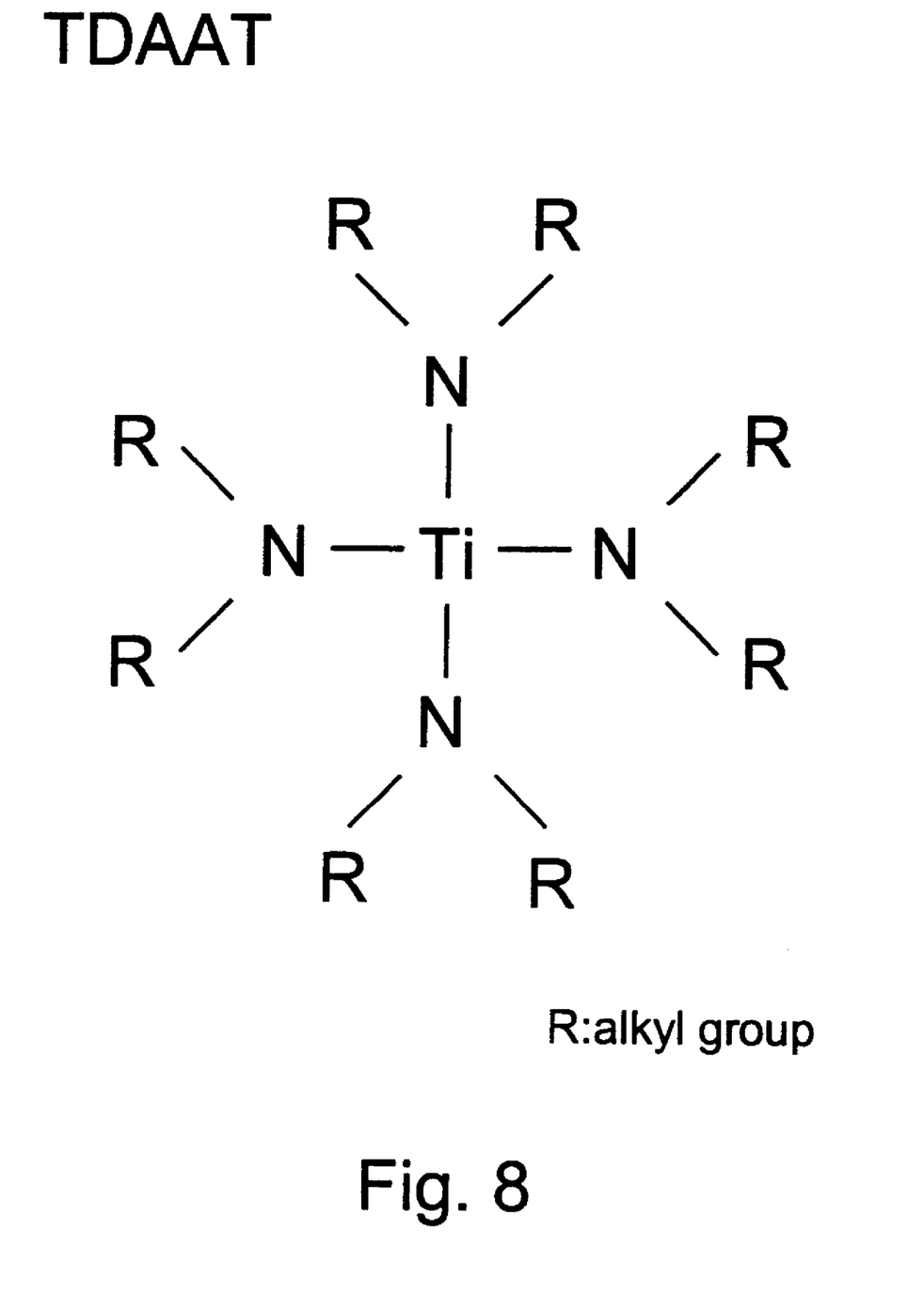
FIG. 8 is a diagram depicting the chemical structural formula of TDAAT.

In view of this situation, attention was attracted in recent years to techniques for fabricating titanium nitride thin films by CVD (chemical vapor deposition). Various CVD techniques and source gases have been proposed for fabricating titanium nitride thin films. One such technique features the use of a tetrakis(dialkylamino)titanium (hereinafter abbreviated as "TDAAT"), an organometallic compound. The chemical structural formula of TDAAT is shown in FIG. 8. In the chemical structural formula, R is an alkyl group. Tetrakis(diethylamino)titanium (hereinafter abbreviated as "TDEAT") is obtained when R is an ethyl group, and tetrakis(dimethylamino)titanium (hereinafter abbreviated as "TDMAT") is obtained when R is a methyl group.

These organotitanium compounds, although liquids at room temperature and atmospheric pressure, can be fed into a reaction vessel through a shower head together with carrier gases such as $H_2$, argon, and $N_2$ when vaporized. A mixed gas (such as added gas) chemically reactive with organotitanium compounds is also fed into the reaction vessel. A substrate is disposed within the reaction vessel, and this substrate is kept at a prescribed reaction temperature.

The organotitanium compound and the mixed gas initiate a reaction that yields titanium nitride, which adheres to the substrate as a titanium nitride film. It is known that the step coverage and electrical characteristics of the titanium nitride thus deposited depend on the reaction pressure, the substrate temperature, and the flow rates of the mixed gas and the organotitanium compound reacting inside the reaction vessel.

For example, according to Raajimaker (Thin Solid Films, 247 (1994), 85) and other sources, the source gas TDAAT is fed to a reaction vessel together with argon (carrier gas), and a titanium nitride thin film is fabricated using ammonia gas ($NH_3$) as an added gas. The flow rate of the ammonia gas is 1000 sccm or greater. The resulting titanium nitride thin film delivers adequate step coverage (85%) when deposited in a contact hole having a diameter of 0.8 μm with an aspect ratio of 1. Applied to contact holes with diameters of 0.35 μm, and less, such as those used for 64-Mbit DRAMS, however, this technology is expected to yield a step coverage of merely 20% or less.

Furthermore, according to Jackson et al. (R. L. Jackson, E. J. MCineney, B. Roberts, J. Strupp, A. Velaga, S. Patel and L. Halliday, Proc. Advanced Metallization for ULSI Application, ed. by D. P. Favreau, Y. Shacham-Diamond, and Y. Horiike (Mat. Res. Soc., Pittsburgh, Pa., 1994), p. 20), a source TDEAT is vaporized by being passed through a vaporizer, and the vaporized material is fed together with a carrier gas (nitrogen gas) to a reaction vessel through a shower head. In addition, ammonia gas ($NH_3$) is added through a shower head in a separate conduit, yielding a titanium nitride thin film. In particular, the cited paper reports on the effect demonstrated by the ratio of the feed rates of the source TDEAT and the ammonia gas. The step coverage decreases from 65% to about 20% as the amount in which the ammonia gas is added increases at a film depositing temperature of 350° C. and a pressure of 10–50 torr in a contact hole with a diameter of 0.35 μm and an aspect ratio of 3.4. On the other hand, the step coverage for the same contact hole decreases to 5% if the film-depositing temperature is raised to 425° C. Thus, the step coverage of fine contact holes becomes inadequate if the flow rate of ammonia gas increases in relation to TDEAT.

Furthermore, Intermann et al. (A. Intermann and H. Koerner, J. Electrochem. Soc., Vol. 140, No. 11 (1993), 3215) published a detailed report on the reasons for the deterioration of step coverage due to the addition of such ammonia gas, concluding that step coverage deteriorates as a result of violent chemical reactions between TDMAT and the ammonia gas.

OBJECTS AND SUMMARY

It is clear that the step coverage of contact holes provided by the conventional techniques described above deteriorates if ammonia gas is added to TDAAT, and this drawback presents a serious challenge to the adoption of techniques in which titanium nitride films are deposited by CVD using organotitanium compounds to the mass production of semiconductor devices. Titanium nitride thin film can also be obtained without the addition of ammonia gas, but this approach is disadvantageous because of the presence of carbon in the films.

An object of this invention is to provide a method and apparatus capable of improving the step coverage of contact holes or grooves when a titanium nitride thin film is fabricated by CVD using TDAAT as a source material.

Another object of this invention is to provide a method and apparatus for suppressing the reactions that yield titanium nitride in the space between the substrate and the gas-supply shower head, and for promoting the reactions that yield titanium nitride on the substrate surface.

According to the present invention, a method for fabricating a titanium nitride thin film in a reaction vessel on a surface of a substrate heated to a prescribed temperature, includes the steps of mixing tetrakis(dialkylamino)titanium and a first carrier gas to create a first mixed gas; feeding the first mixed gas into the reaction vessel through a first set of nozzles, while confining the flow rate of the tetrakis (dialkylamino)titanium to a range of 0.004–0.2 g/min. and confining the flow rate of the first carrier gas mixed with the tetrakis(dialkylamino)titanium to a range of 100–1000 sccm.; mixing an added gas reactive with the tetrakis (dialkylamino)titanium with a second carrier gas to create a second mixed gas; feeding the second mixed gas into the reaction vessel through a second set of nozzles, while confining the flow rate of the added gas to a range of 10–100 sccm. and confining the flow rate of the second carrier gas to a range of 10–500; sccm.; and depositing a titanium nitride thin film by the first mixed gas and the second mixed gas while confining the pressure inside the reaction vessel to a range of 0.1–15 Pa.

A CVD apparatus for fabricating a titanium nitride thin film according to the present invention includes an evacuatable reaction vessel having an interior, a pumping apparatus capable of exhausting the reaction vessel and maintaining the interior of the reaction vessel at a prescribed pressure, a gas feeder for introducing a mixed gas into the reaction vessel, a substrate holder in the reaction vessel for holding a substrate to be coated with a titanium nitride thin film, and a heater for heating the substrate. The gas feeder is equipped with the following components: (a) a vaporizer for vaporizing tetrakis(dialkylamino)titanium from a liquid source material, (b) a first flow controller capable of setting a flow rate of the vaporized tetrakis(dialkylamino)titanium to any level within a range of 0.004–0.2 g/min, (c) a second flow controller capable of setting a flow rate of a first carrier gas mixed with the tetrakis(dialkylamino)titanium to any level within a range of 100–1000 sccm, (d) a third flow controller capable of setting a flow rate of an added gas reactable with the tetrakis(dialkylamino)titanium to any level within a range of 10–100 sccm, (e) a fourth flow controller capable of setting a flow rate of a second carrier gas being mixed with the added gas to any level within a range of 10–500 sccm, (f) a first supply conduit for mixing the tetrakis(dialkylamino)titanium and the first carrier gas to create a first mixed gas and guiding the resulting first mixed gas into the reaction vessel, (g) a second supply conduit for mixing the mixed gas and the second carrier gas to create a second mixed gas and guiding the resulting second mixed gas into the reaction vessel, and (h) a shower head which is provided with a plurality of first nozzles connected to the first supply conduit, and a plurality of second nozzles connected to the second supply conduit, and which is configured such that the first and second mixed gases are fed into the reaction vessel through the nozzles.

DETAILED DESCRIPTION OF THE PREFERRED EMBODIMENTS

A method for fabricating a titanium nitride thin film in accordance with this invention entails depositing a titanium nitride thin film on a substrate by CVD using a tetrakis (dialkylamino)titanium (TDAAT) and an added gas reactive therewith. Optimum ranges of flow rates may be established for the TDAAT, a first carrier gas therefor, the added gas, and a second carrier gas therefor. Specifically, the flow rate of TDAAT may be 0.004–0.2 g/min, that of the first carrier gas is 100–1000 sccm, that of the added gas is 10–100 sccm, and that of the second carrier gas is 10–500 sccm. A mixed gas (first mixed gas) consisting of TDAAT and the first carrier gas is fed into a reaction vessel through first nozzles, and a mixed gas (second mixed gas) consisting of the added gas and the second carrier gas is fed into the reaction vessel through second nozzles. Thus, the first and second mixed gases have no contact with each other before entering the reaction vessel because these two types of mixed gases are fed into the reaction vessel through supply conduits belonging to separate systems. The pressure inside the reaction vessel is kept at 0.1–15 Pa.

The flow rates of the TDAAT and added gas can be adjusted with the aid of respective flow controllers. In addition, the flow rate of the second carrier gas for the added gas can be controlled by a dedicated flow controller. This approach makes it possible to feed the added gas at a very low flow rate (10–100 sccm). In other words, the flow velocity of the added gas can be kept at the desired level by adjusting the flow rate of the second carrier gas even when the added gas is fed at a very low flow rate in such a manner. As a result, the added gas can be carried all the way up to the substrate surface without lowering the pressure of the system for introducing the added gas. It is therefore possible to suppress violent chemical reactions in the space occupied by the TDAAT and added ammonia gas, to promote the reactions on the substrate surface, and to provide satisfactory step coverage for the titanium nitride thin film.

TDEAT or TDMAT can be used as the TDAAT. Ammonia gas can typically be used as the added gas reactive with the TDAAT. Methyl hydrazine may also be used. It is best to use nitrogen gas both for the first carrier gas and for the second carrier gas. The carrier gases should not contribute to chemical reactions involving TDAAT. The flow velocities of the TDAAT and added gas can be individually adjusted by adjusting the flow rates of the carrier gases.

In this invention, the flow rate of the added gas (typically ammonia gas) is preferably kept at 10–100 sccm, making it possible to ensure good step coverage at a lower flow rate than that achieved by a conventional technique. Flow rate conditions for other gases are established when the added gas is used in such a small amount.

The flow rate of TDAAT is confined to a range of 0.004–0.2 g/min. When the flow rate of TDAAT is less than 0.004 g/min, the titanium nitride thin film forms at a very low rate (about 1 nm/min or less), making the process impractical. The upper limit of the flow rate of TDAAT is the maximum flow rate at which vaporization is still possible; this limit is preferably about 0.2 g/min.

The flow rate of the first carrier gas is preferably confined to a range of 100–1000 sccm. A minimum flow rate of about 100 sccm is preferred to vaporize the TDAAT. On the other hand, increasing the flow rate of the first carrier gas is undesirable because such an increase raises the pressure inside the reaction vessel. Due to such considerations, it is preferable for the flow rate of the first carrier gas to be set to about 1000 sccm or lower.

The flow rate of the added gas is preferably confined to a range of about 10–100 sccm, which is considerably lower than any rate afforded by a conventional technique. Because a reaction between TDAAT and an added gas is utilized, the minimum flow rate of the added gas should be about 10 sccm. On the other hand, increasing the flow rate of the added gas tends to adversely affect the step coverage, and a flow rate of about 100 sccm is the practical limit beyond which adequate step coverage cannot be obtained.

The flow rate of the second carrier gas is preferably confined to a range of about 10–500 sccm. It is undesirable for the flow rate of the second carrier gas to be less than 10 sccm because of the poor step coverage of the titanium nitride thin film. The step coverage improves once the flow rate of the second carrier gas is 10 sccm or higher. The step coverage remains virtually unchanged if the flow rate of the second carrier gas is increased further. On the other hand, increasing the flow rate of the second carrier gas is undesirable because of the increased pressure inside the reaction vessel. Because of these considerations, the flow rate of the second carrier gas should preferably be set to 500 sccm or less.

In this invention, the flow velocity of the second mixed gas should preferably be set to 0.17 m/sec or higher. The step coverage of a titanium nitride thin film improves when the flow velocity of the second mixed gas is 0.17 m/sec or higher. Because the second mixed gas contains an added gas, setting the flow velocity of the second mixed gas to 0.17 m/sec or higher is equivalent to setting the flow velocity of the added gas to 0.17 m/sec or higher.

The first and second mixed gases are fed into the reaction vessel through the first and second nozzles provided to a shower head. These nozzles have comparatively small diameters, and the thickness distribution of the titanium nitride thin film is improved by providing a plurality of such nozzles in dispersed form. When the diameters of the first and second nozzles are each set to 4 mm or less, setting the distance L (hereinafter "the nozzle interval") between the centers of the first and second nozzles to 1 cm or greater improves the step coverage of the titanium nitride thin film.

The role played by the nozzle interval L will now be considered. If it is assumed that the pressure inside the reaction vessel is 50 mtorr (6.7 Pa), the mean free path of the gas molecules will be about 1 mm. Under such pressure conditions, a gas molecule will, on average, collide with other gas molecules about ten times as it covers a distance of 1 cm. If it is assumed in this case that the nozzle interval L is 1 cm, then the TDAAT discharged from a first nozzle will advance about 5 mm while colliding about five times with other gas molecules, and the added gas discharged from a second nozzle will advance about 5 mm while colliding about five times with other gas molecules before the two gases meet. In other words, it is possible to prevent TDAAT and the added gas from meeting each other and joining together in a vigorous reaction. A spatial reaction between the added gas and TDAAT can thus be suppressed by setting the nozzle interval at or above a prescribed level.

When TDAAT and the added gas undergo chemical reactions and form a titanium nitride thin film, the substrate surface and the space inside the reaction vessel appear to be the two locations where these chemical reactions originate. The reaction occurring inside the reaction vessel is called a spatial reaction, and the reaction occurring on the substrate surface is called a surface reaction. It is important to minimize the spatial reaction and to allow the surface reaction to proceed as the principal reaction in order to improve the step coverage of the titanium nitride thin film. Setting the flow velocity of the second mixed gas to 0.17 m/sec, or higher, or setting the nozzle interval L to 1 cm, or greater, is effective for suppressing the spatial reaction.

Figure 1:
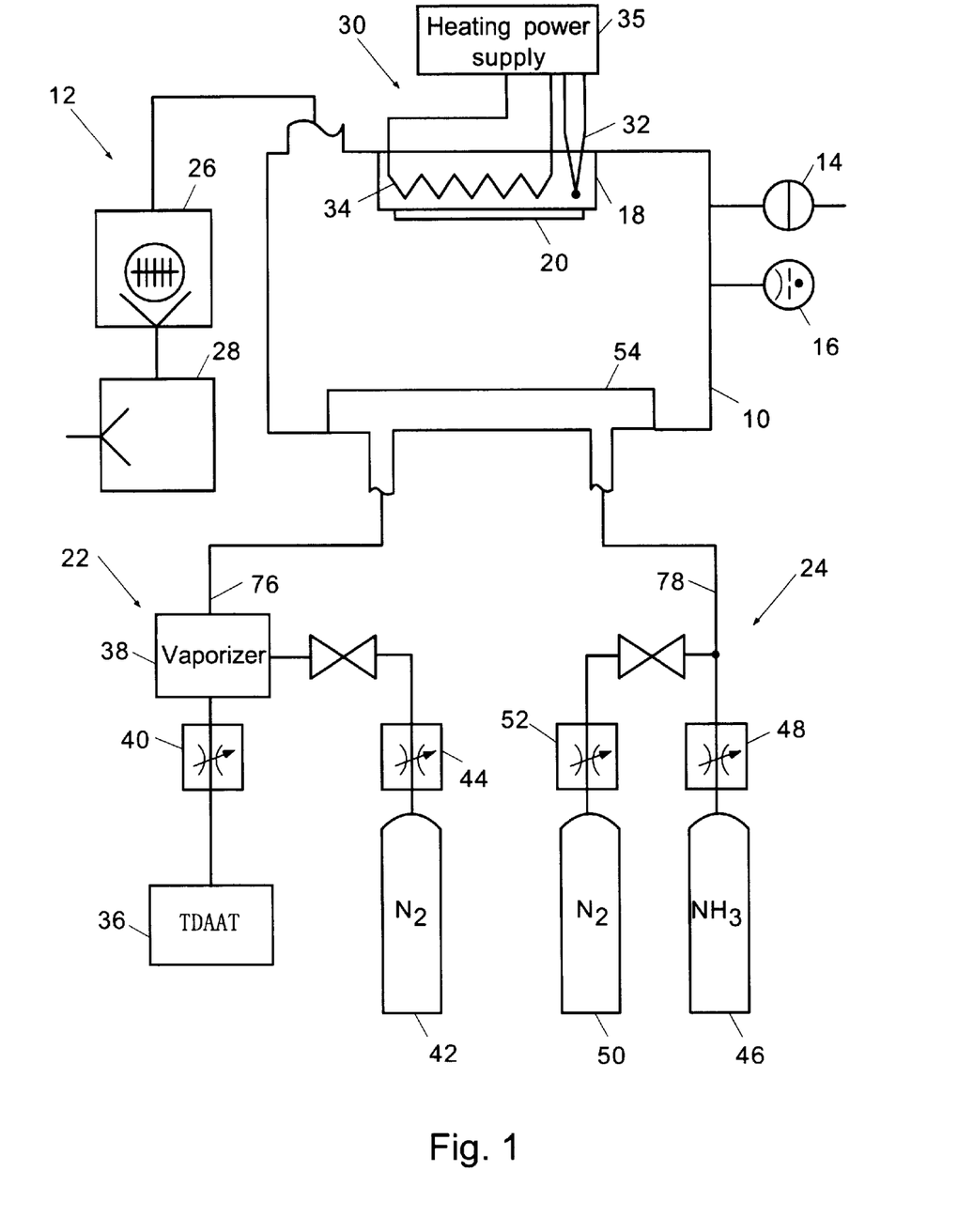
FIG. 1 is a block diagram of an example of a CVD apparatus for implementing the method for fabricating a titanium nitride thin film in accordance with this invention.

FIG. 1 is a block diagram of an example of a CVD apparatus implementing the proposed method for fabricating a titanium nitride thin film. A substrate holder 18 is disposed inside a reaction vessel 10, and a substrate 20 is attached to this substrate holder 18. The titanium nitride thin film is deposited on the surface of this substrate 20. A shower head 54 for introducing gases is positioned facing the substrate holder 18, and the added gas from an added gas introduction system 24 can be introduced together with the source gas from a source gas introduction system 22 via this shower head 54.

The reaction vessel 10 is made of stainless steel and can be evacuated with the aid of an exhaust system 12. The interior can be kept airtight. The exhaust system 12 comprises a turbomolecular pump 26 and a dry pump 28. The exhaust system 12 can exhaust the interior of the reaction vessel 10 to a pressure of $10^{-4}$ Pa and can maintain the desired pressure. The dry pump 28 is a V060F dry pump manufactured by Anelva, and the pumping speed is 1000 L/min.

A low-vacuum first vacuum gage 14 and a high-vacuum second vacuum gage 16 are used as vacuum gages for measuring the pressure inside the reaction vessel 10. The first vacuum gage 14 is a high-precision diaphragm vacuum gage with a pressure measurement range of 0.1–133 Pa. In the present embodiment, a type 128A barratron manufactured by MKS is used. The second vacuum gage 16 is an electromagnetic vacuum gage with a pressure measurement range of $10^{-2}$–$10^{-6}$ Pa. In the present embodiment, a BA Gage UGD-1S manufactured by Anelva is used.

The substrate holder 18 is provided with a substrate-heating apparatus 30 for heating the substrate 20. The substrate-heating apparatus 30 comprises a thermocouple 32 for measuring the temperature of the substrate 20, a heater 34, and a heating power supply 35. The heating power supply 35 allows the substrate temperature to be subjected to PID control (or PI control, ON-OFF control, fuzzy control, or another control system) on the basis of temperature measurements.

The source gas introduction system 22 comprises a source container 36 for storing TDAAT (liquid source material), a vaporizer 38 for vaporizing the liquid TDAAT, a first flow controller 40 for controlling the flow rate of the vaporized TDAAT gas, a gas cylinder 42 for storing the carrier gas (first carrier gas) for the TDAAT gas, and a second flow controller 44 for controlling the flow rate of the first carrier gas. The vaporizer 38 is a VU-104 manufactured by Lindeck. No bubbling is performed. The vaporized TDAAT is mixed with the first carrier gas and fed to the shower head 54 through a first supply conduit 76.

The added gas introduction system 24 comprises an added gas cylinder 46 for storing the added gas (typically ammonia gas), a third flow controller 48 for controlling the flow rate of the added gas, a gas cylinder 50 for storing the carrier gas (second carrier gas) for the added gas, and a fourth flow controller 52 for controlling the flow rate of the second carrier gas. The added gas is mixed with the second carrier gas and fed to the shower head 54 via a second supply conduit 78.

Typical examples of various gases are TDEAT for the source gas, ammonia gas for the added gas, and nitrogen gas for the first and second carrier gases. Unless specified to the contrary, typical gases will be used in the descriptions hereinbelow.

Figure 2:
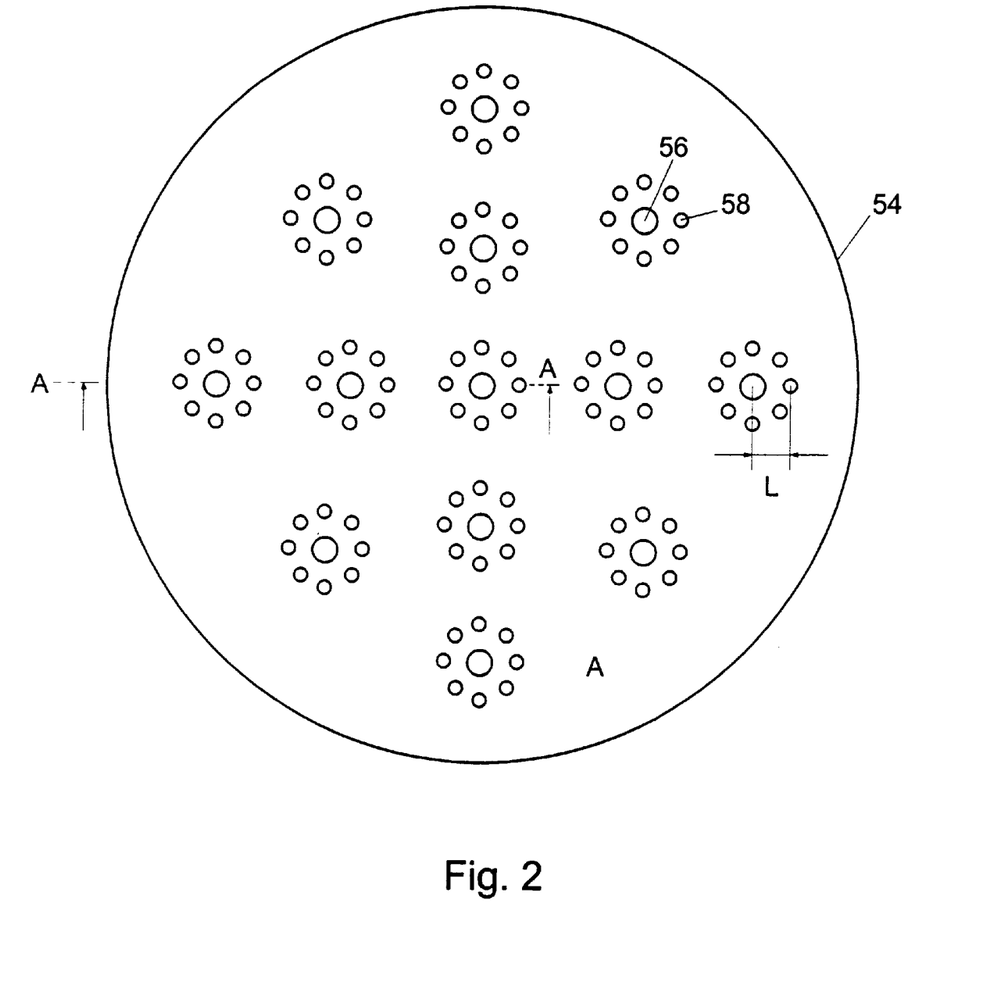
FIG. 2 is a plan view of a shower head.
Figure 3:
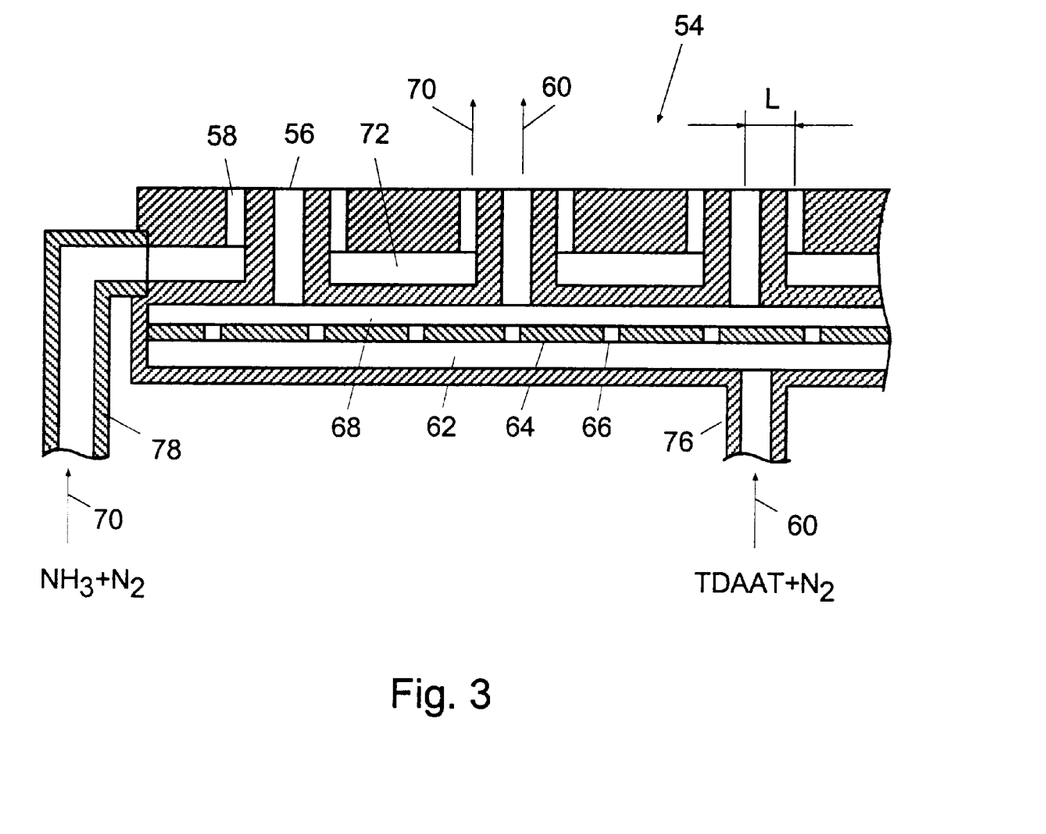
FIG. 3 is a cross section taken along line 3—3 in FIG. 2.

FIG. 2 is a plan view of the shower head 54 for gas introduction, and FIG. 3 is cross section A—A in FIG. 2. In FIG. 2, the upper surface of the shower head 54 is provided with numerous first nozzles 56 for discharging a source gas (TDAAT), and eight second nozzles 58 for discharging an added gas (ammonia gas) are arranged around each of the first nozzles 56. The drawing is merely a schematic representation. An actual shower head 54 may have about 30–40 first nozzles 56 on its upper surface (diameter: about 250 mm), and eight second nozzles 58 around each of the first nozzles 56. In the present embodiment, the diameter of the first nozzles 56 is 3 mm, and that of the second nozzles 58 is 1.5 mm. As described above, the distance L between the centers of the first nozzles 56 and second nozzles 58 has an important meaning. The distance L between the centers will hereinafter be referred to as "the nozzle interval L." In FIG. 3, the mixed gas (first mixed gas) 60 consisting of a source gas and a carrier gas initially enters the first diffusion chamber 62 of the shower head 54 through the first supply conduit 76. The gas then enters a second diffusion chamber 68 through the dispersing holes 66 formed in a dispersing plate 64. After being uniformly mixed in the diffusion chambers 62 and 68, the gas enters the reaction vessel through the first nozzles 56. Meanwhile, the mixed gas (second carrier gas) 70 consisting of an added gas and a carrier gas enters the third diffusion chamber 72 of the shower head 54 through the second supply conduit 78 and proceeds into the reaction vessel through the second nozzles 58.

Figure 4:
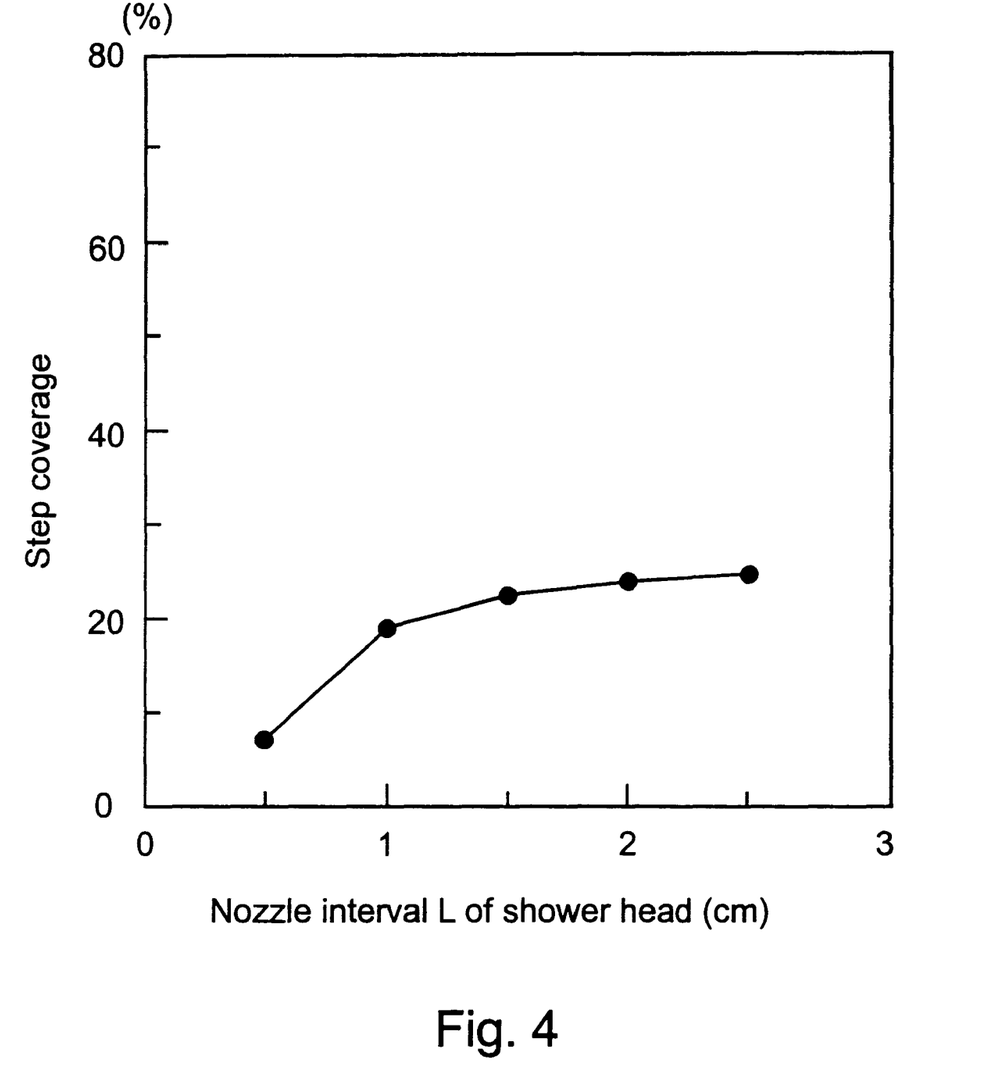
FIG. 4 is a graph depicting the relationship between the nozzle interval L of the shower head and the step coverage of a titanium nitride thin film.

FIG. 4 is a graph depicting the relationship between the nozzle interval L of the shower head and the step coverage of a titanium nitride thin film fabricated using the CVD apparatus in FIG. 1. The nozzle interval L on the upper surface of the shower head is plotted on the horizontal axis, and the step coverage of a titanium nitride thin film having contact holes with a diameter of 0.5 μm and an aspect ratio of 4 is plotted on the vertical axis. The conditions for fabricating the titanium nitride thin film were as follows. TDEAT was used as the source material, and its flow rate was set to 0.004–0.2 g/min. Nitrogen gas was used as the first carrier gas, and its flow rate was set to 350 sccm. Ammonia gas was used as the added gas, and its flow rate was set to 10 sccm. Nitrogen gas was used as the second carrier gas, and its flow rate was set to 100 sccm. The film-depositing temperature was 573° K., and the pressure inside the reaction vessel was 6.7 Pa.

As is evident in FIG. 4, step coverage improves with an increase in the nozzle interval L of the shower head. The step coverage remains at 20%, or higher, when the nozzle interval L is 1 cm or greater. By contrast, the step coverage deteriorates when the nozzle interval L is 1 cm or less, dropping to about several percent at a nozzle interval of 0.5 cm. The trend remains the same when TDMAT is used as the source material.

It should be noted that the nozzle interval between two adjacent first nozzles 56 affects the film thickness distribution. The film thickness is distributed less uniformly if the nozzle interval between two adjacent first nozzles 56 is excessively large. The nozzle interval between two adjacent first nozzles 56 should preferably be 5 cm or less if the uniformity of the film thickness distribution is taken into account. In view of the fact that the second nozzles 58 are arranged around the first nozzles 56, as shown in FIG. 2, the nozzle interval L between a first nozzle 56 and the surrounding second nozzles 58 should not be more than half the nozzle interval between two adjacent first nozzles 56. Consequently, the maximum nozzle interval L between a first nozzle 56 and a second nozzle 58 is 2.5 cm when the nozzle interval between two adjacent first nozzles 56 is 5 cm. Thus, taking the film thickness distribution into account as well, it is preferable for the nozzle interval L to be confined to a range of 1–2.5 cm.

Figure 5:
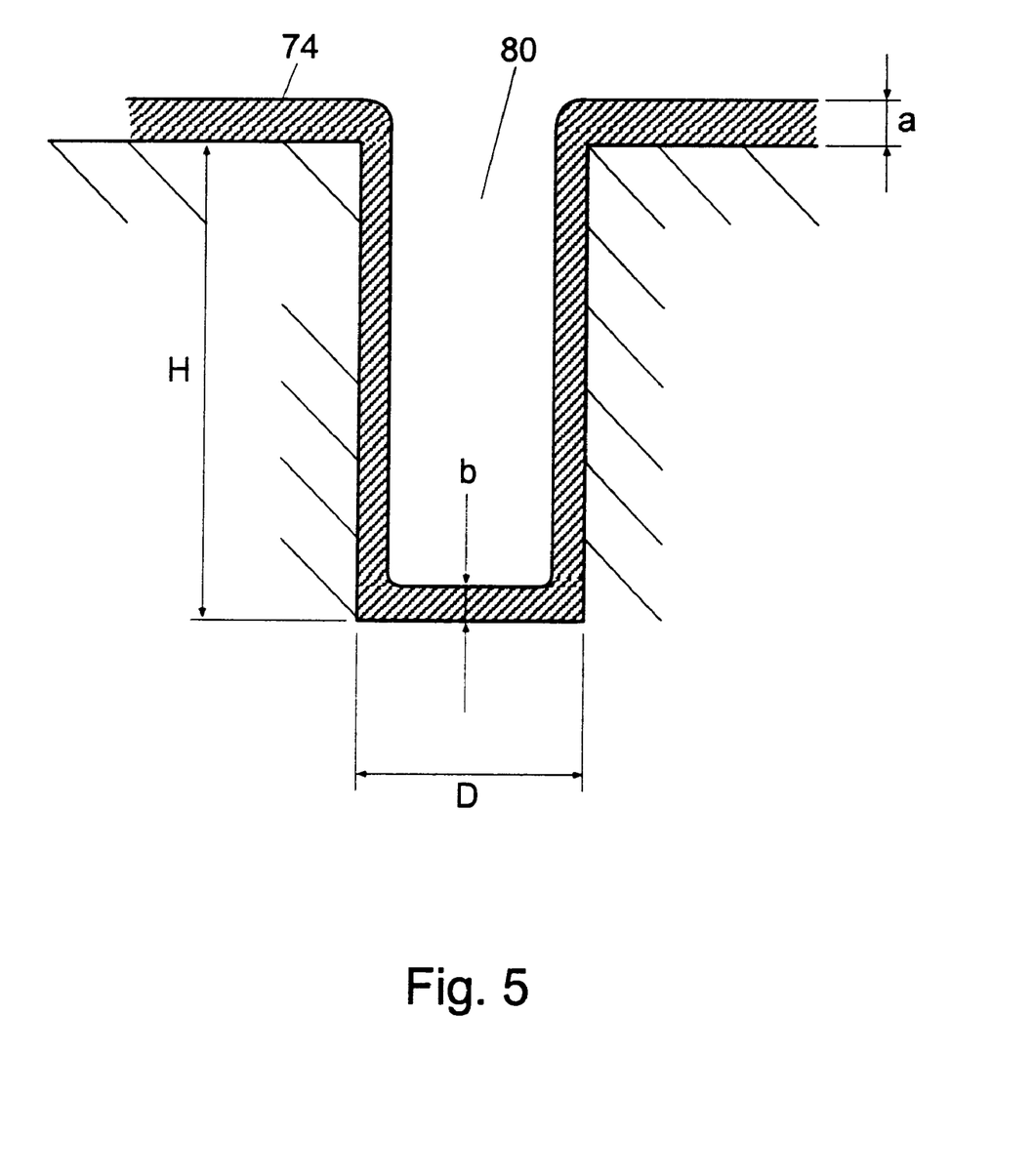
FIG. 5 is a cross section of a contact hole formed in a titanium nitride thin film.

FIG. 5 is a cross section of a contact hole formed in a titanium nitride thin film. The aspect ratio of the contact hole 80 is defined as (height H)÷(hole diameter D). Furthermore, step coverage of the contact hole 80 is defined as a ratio of the thickness b of the deposit on the bottom of the contact hole to the thickness a of the deposit in areas outside the contact hole of the titanium nitride thin film 74. In other words, step coverage (%)=(b/a)÷100. The step coverage was measured under an SEM.

Figure 6:
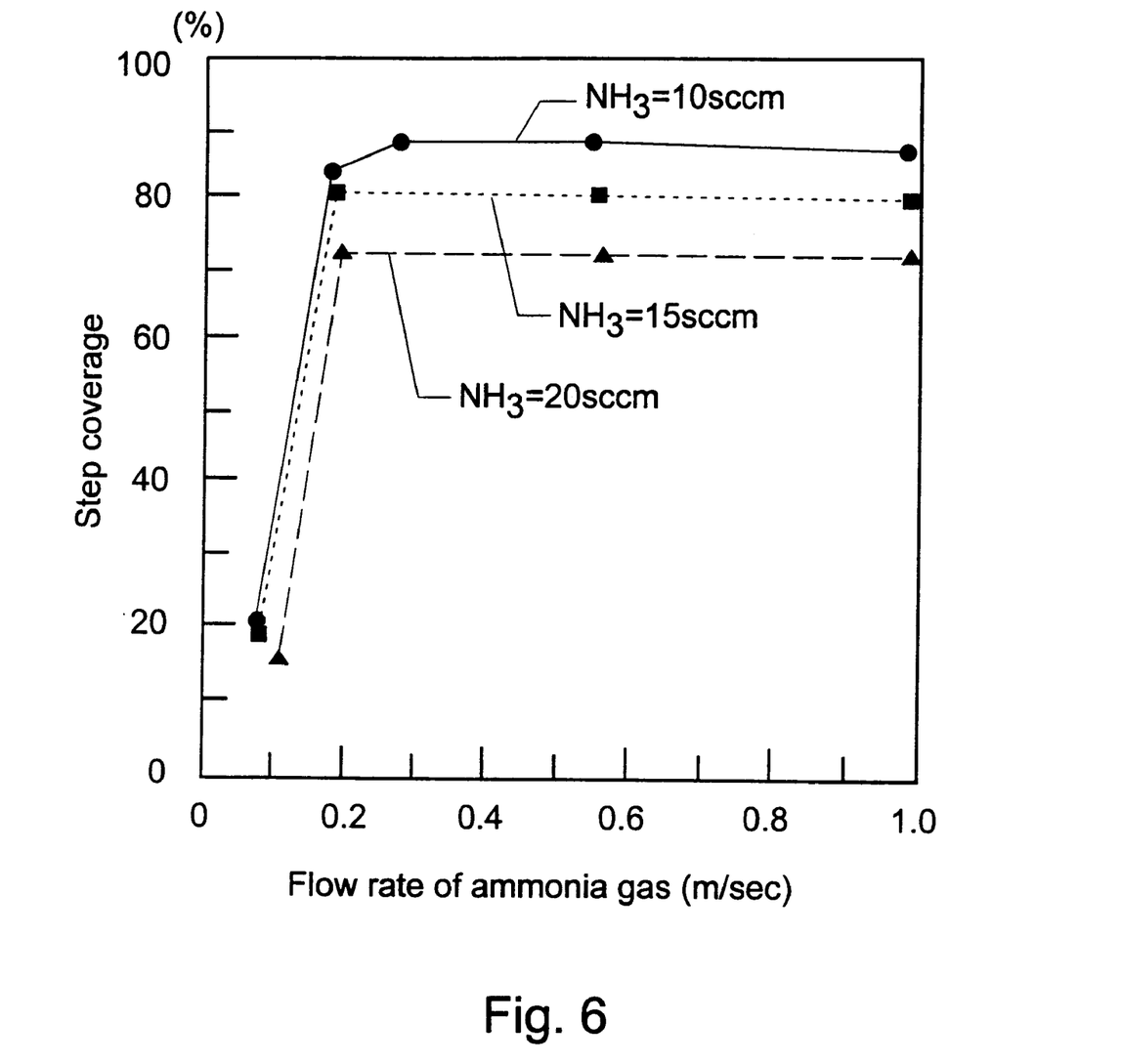
FIG. 6 is a graph depicting the relationship between the step coverage of a titanium nitride thin film and the flow velocity of ammonia gas.

FIG. 6 is a graph depicting the relationship between the step coverage of the titanium nitride thin film and the flow velocity of the added gas (ammonia gas)(flow velocity near a second nozzle). The flow velocity of the ammonia gas, which is equal to the flow velocity of the second mixed gas, is plotted on the horizontal axis, and the step coverage of the titanium nitride thin film in the aforementioned contact hole is plotted on the vertical axis. The conditions for fabricating the titanium nitride thin film were as follows. The nozzle interval L was set to 25 mm. TDEAT was used as the source material, and its flow rate was set to 0.004–0.2 g/min. Nitrogen gas was used as the first carrier gas, and its flow rate was set to 350 sccm. Ammonia gas was used as the added gas, and its flow rate was set to 10–20 sccm. Nitrogen gas was used as the second carrier gas, and its flow rate was varied to keep the flow velocity of the second mixed gas at the desired level. The film-depositing temperature was 573° K., and the pressure inside the reaction vessel was 6.7 Pa.

As is evident in FIG. 6, step coverage can be rapidly increased by raising the flow velocity of the ammonia gas. Adequate step coverage can be obtained by setting the flow velocity to about 0.17 m/sec or higher, and the coverage remains satisfactory (70% or higher) irrespective of whether the flow rate of the ammonia gas is 10, 15, or 20 sccm. Although the step coverage tends to deteriorate as the flow rate of the ammonia gas rises from 10 sccm to 20 sccm, it can still be maintained at 70% by keeping the flow velocity at 0.17 m/sec or higher even when the flow rate of the ammonia gas is 20 sccm.

The flow rate of the second carrier gas should be varied to keep the flow rate of the ammonia gas at the desired level while varying the flow velocity of the ammonia gas. The flow velocity of the ammonia gas, which is equal to the flow velocity of the second mixed gas, can be determined based on the flow rate of the second mixed gas, the diameter of the second nozzles, and the pressure inside the reaction vessel.

Figure 7:
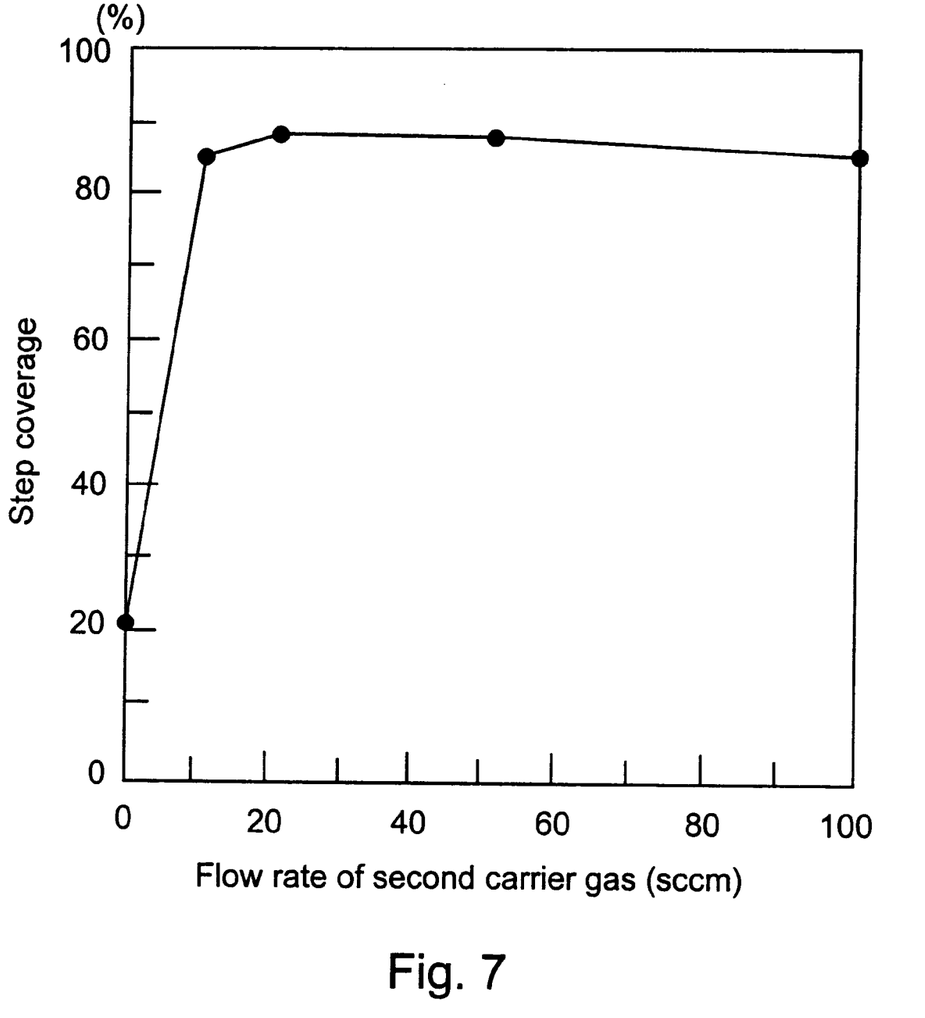
FIG. 7 is a graph depicting the relation between the step coverage of a titanium nitride thin film and the flow rate of the second carrier gas.

FIG. 7 is a graph depicting the relationship between the step coverage of a titanium nitride thin film and the flow rate of the second carrier gas. The flow rate of the second carrier gas is plotted on the horizontal axis, and the step coverage of the titanium nitride thin film in the area of the aforementioned contact hole is plotted on the horizontal axis. The conditions for fabricating the titanium nitride thin film were as follows. The nozzle interval L was set to 25 mm. TDEAT was used as the source material, and its flow rate was set to 0.004–0.2 g/min. Nitrogen gas was used as the first carrier gas, and its flow rate was set to 350 sccm. Ammonia gas was used as the added gas, and its flow rate was set to 10 sccm. The film-depositing temperature was 573° K., and the pressure inside the reaction vessel was 6.7 Pa. The titanium nitride thin film was fabricated while the flow rate of the second carrier gas was varied between 0 and 100 sccm.

As is evident in FIG. 7, step coverage is about 20% in the absence of a second carrier gas. It can also be seen that step coverage rapidly improves as the flow rate of the second carrier gas gradually increases from zero. The step coverage improves to about 85% as the flow rate of the second carrier gas is raised to 10 sccm. The step coverage reaches about 90% when the flow rate of the second carrier gas is further increased to 20 sccm. However, any additional increase in the flow rate of the second carrier gas fails to bring about a further improvement in step coverage. Rather, the step coverage tends to deteriorate slightly if the flow rate of the second carrier gas is raised to 100 sccm. The same results were obtained when TDMAT was used as the source gas.

The following mechanism might be the reason that step coverage is improved by passing the second carrier gas at or above a prescribed flow rate. It is believed that the phenomena described below occur when an added gas is fed at a very low flow rate (about 10–20 sccm) without the use of a second carrier gas. In FIG. 3, the flow rate of the added gas fed at a very low flow rate is not particularly high, so part of it is dispersed into the second diffusion chamber 68 of the shower head through the first nozzles 56 after escaping from the second nozzles 58. The reason for this is that the partial pressure of the added gas is lower in the second diffusion chamber 68 than in the reaction vessel. This, naturally, causes the added gas to diffuse back from the reaction vessel to the second diffusion chamber 68. As a result, a chemical reaction occurs in the second diffusion chamber 68 between the source gas and the added gas, promoting the spatial reaction. The surface reaction on the substrate is thus impeded, adversely affecting step coverage. Another drawback is that the titanium nitride thin film is apt to deposit in the shower head, resulting in the formation of dust particles. These factors make it impossible to expect that step coverage will be improved merely by feeding an added gas at a very low flow rate. By contrast, there is virtually no diffusion of the added gas into the second diffusion chamber 68 when this gas is mixed with a second carrier gas, and a certain flow velocity is maintained.

In the experiments illustrated by the graphs in FIGS. 4, 6, and 7 above, the flow rate of TDEAT was set to 0.004–0.2 g/min. Experimental conditions corresponding to the specified ranges of numerical values were adopted because step coverage is virtually unaffected as long as the flow rate of TDEAT is confined to this range. The flow rate of TDEAT has an affect on the deposition rate.

The experimental results described above indicate that the following conditions are desirable for obtaining adequate step coverage during the fabrication of a titanium nitride thin film. First, as can be seen from the graph in FIG. 4, the nozzle interval L of the shower head should preferably be set to 1 cm or greater. Next, as can be seen from the graph in FIG. 6, the flow velocity of the added gas should be set to 0.17 m/sec or higher. Finally, as can be seen from the graph in FIG. 7, the flow rate of the second carrier gas should be set to 10 sccm or higher.

The present invention allows films that have satisfactory step coverage despite the presence of contact holes with high aspect ratios to be obtained by establishing optimum ranges for the flow rates of TDAAT, the first carrier gas, and the second carrier gas when a titanium nitride thin film is fabricated using the TDAAT, and an added gas at a very low flow rate (10–100 sccm). In addition, the spatial reaction between the TDAAT and the added gas can be suppressed. And, the surface reaction on the substrate can be promoted by setting the flow velocity of a second mixed gas, which consists of the added gas and the second carrier gas, to 0.17 m/sec or higher, and by setting the interval between the first and second nozzles of the shower head to 1 cm or greater, making it possible to achieve adequate step coverage even for contact holes with high aspect ratios.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method for fabricating a titanium nitride thin film in a reaction vessel on a surface of a substrate heated to a prescribed temperature, comprising the steps of:

mixing tetrakis(dialkylamino)titanium and a first carrier gas to create a first mixed gas;

feeding the first mixed gas into the reaction vessel through a first set of nozzles, while confining the flow rate of the tetrakis(dialkylamino)titanium to a range of 0.004–0.2 g/min. and confining the flow rate of the first carrier gas mixed with the tetrakis(dialkylamino)titanium to a range of 100–1000 sccm.;

mixing an added gas reactive with the tetrakis (dialkylamino)titanium with a second carrier gas to create a second mixed gas;

feeding the second mixed gas into the reaction vessel through a second set of nozzles, while confining the flow rate of the added gas to a range of 10–100 sccm. and confining the flow rate of the second carrier gas to a range of 10–500 sccm.; and depositing a titanium nitride thin film by means of the first mixed gas and the second mixed gas while confining the pressure inside the reaction vessel to a range of 0.1–15 Pa.

2. The method as defined in claim 1, wherein the flow velocity of the second mixed gas through the second nozzles is set to 0.17 m/sec or greater.

3. The method as defined in claim 1, wherein a diameter of the first and second nozzles is set to 4 mm or less, and a distance between the centers of each of the first nozzles and a closest one of the second nozzles is 1 cm, or greater.

4. The method as defined in claim 3, wherein a distance between the centers of each of the first nozzles and a closest one of the second nozzles is within a range of 1–2.5 cm.

5. The method as defined in claim 1, wherein said tetrakis(dialkylamino)titanium is tetrakis(diethylamino) titanium, and said added gas is ammonia gas.

* * * * *